United States Patent
Tan

(10) Patent No.: US 12,327,969 B2
(45) Date of Patent: Jun. 10, 2025

(54) PLUG AND AN ELECTRONIC DEVICE

(71) Applicant: DONGGUAN YUANCHUANG ELECTRONIC TECHNOLOGY CO., LTD., Dongguan (CN)

(72) Inventor: Hongping Tan, Dongguan (CN)

(73) Assignee: DONGGUAN YUANCHUANG ELECTRONIC TECHNOLOGY CO., LTD., Dongguan (CN)

(*) Notice: Subject to any disclaimer, the term of this patent is extended or adjusted under 35 U.S.C. 154(b) by 423 days.

(21) Appl. No.: 17/811,308

(22) Filed: Jul. 8, 2022

(65) Prior Publication Data

US 2023/0178948 A1   Jun. 8, 2023

(30) Foreign Application Priority Data

Dec. 8, 2021   (CN) .......................... 202123087134.6

(51) Int. Cl.
| H01R 13/648 | (2006.01) |
| H01R 31/06 | (2006.01) |
| H01R 13/22 | (2006.01) |
| H01R 13/62 | (2006.01) |

(52) U.S. Cl.
CPC ........... H01R 31/065 (2013.01); *H01R 13/22* (2013.01); *H01R 13/6205* (2013.01)

(58) Field of Classification Search
CPC ... H01R 31/065; H01R 13/22; H01R 13/6205
USPC ....................................................... 439/108
See application file for complete search history.

(56) References Cited

U.S. PATENT DOCUMENTS

| 9,112,327 | B2* | 8/2015 | Sarwar | ................ G06F 13/4068 |
| 9,515,420 | B2* | 12/2016 | Daoura | ................ H01R 13/502 |
| 9,991,628 | B2* | 6/2018 | Daoura | ............. H01R 13/6205 |
| 10,333,249 | B1* | 6/2019 | Wang | ................. H01R 13/6205 |
| 2008/0248692 | A1* | 10/2008 | Ni | .................... G06K 19/07743 29/592.1 |

(Continued)

FOREIGN PATENT DOCUMENTS

| CN | 208890007 U | * | 5/2019 |
| CN | 209608020 U | * | 11/2019 |
| CN | 210779085 U | * | 6/2020 |

(Continued)

*Primary Examiner* — Abdullah A Riyami
*Assistant Examiner* — Vladimir Imas
(74) *Attorney, Agent, or Firm* — Andrew C. Cheng

(57) ABSTRACT

The present disclosure relates generally to a plug and an electronic device. The plug includes a terminal and a connecting portion electrically connected to the terminal. The terminal is used to insert into a socket of an electronic equipment, and the connecting portion is used to magnetically connect with a peripheral female connector for charging and/or data transmission. The plug further includes a first chip and a PCB board disposed at an end of the terminal close to the connecting portion. The terminal and the first chip are electrically connected to the PCB board. The connecting portion includes a conductive structure electrically connected to the PCB board. An accommodating space for accommodating the first chip is defined between the conductive structure and the PCB board, which improves the space utilization rate of the plug. The electronic device of the present disclosure has the same beneficial effects as the plug.

19 Claims, 5 Drawing Sheets

(56) References Cited

U.S. PATENT DOCUMENTS

2013/0244491 A1* 9/2013 Sarwar ................ G06F 13/4068
          439/655
2023/0178948 A1* 6/2023 Tan ........................ H05K 3/366
          439/39

FOREIGN PATENT DOCUMENTS

| CN | 112531375 A | * | 3/2021 | |
|----|-------------|---|--------|---|
| CN | 214754301 U | * | 11/2021 | |
| CN | 113871917 A | * | 12/2021 | |
| CN | 216903659 U | * | 7/2022 | ........... H01R 31/065 |
| WO | WO-2023103271 A1 | * | 6/2023 | ........... H01R 31/065 |

* cited by examiner

PLUG AND AN ELECTRONIC DEVICE

TECHNICAL FIELD

The present disclosure relates generally to the technical field of electronic accessories, and more particularly to a plug and an electronic device.

BACKGROUND

A magnetic charging cable is a charging cable for charging or data transmission via a male connector magnetically connected with a female connector.

The charging chip of the existing magnetic plug is generally disposed at the magnetic end of the magnetic cable, which leads to low space utilization of the plug.

SUMMARY

To solve the problem of low space utilization rate of the existing magnetic plug, the present disclosure provides a plug and an electronic device.

To solve the technical problem, an embodiment of the present disclosure provides a plug. The plug includes a terminal and a connecting portion electrically connected to the terminal. The terminal is used to insert into a socket of an electronic equipment. The connecting portion is used to magnetically connect with a peripheral female connector, so as to achieve charging and/or data transmission of the electronic equipment.

The plug further includes a PCB board and a first chip. The PCB board is disposed at one end of the terminal close to the connecting portion. The terminal and the first chip are both electrically connected to the PCB board. The connecting portion includes a conductive structure electrically connected to the PCB board. An accommodating space is defined between the conductive structure and the PCB board, and the first chip is disposed therein.

Preferably, a limiting member is disposed between the conductive structure and the PCB board. The accommodating space for accommodating the first chip is defined by the limiting member.

Preferably, the size of the accommodating space is adapted to that of the first chip.

Preferably, the inner wall of the limiting member is made of insulating materials.

Preferably, the first chip is a Type-C fast-charging-protocol chip or a Lightning fast-charging-protocol chip.

Preferably, the plug further includes a second chip electrically connected to the PCB board. The first chip and the second chip are arranged on opposite sides of the PCB board.

Preferably, the type of the first chip is different from that of the second chip, one chip is a fast-charging-protocol chip and the other chip is a charging chip.

Preferably, the terminal further includes a fixing member wrapping the PCB board.

Preferably, the connecting portion further includes a magnetic member surrounding the conductive structure. An end of the conductive structure away from the PCB board protrudes from the surface of the magnetic member away from the fixing member.

Preferably, the magnetic member is round-shaped or oval-shaped, so that a 360-degree magnetic attraction or a 180-degree connection between the plug and the peripheral female connector is achieved.

Preferably, the fixing member includes a fixing sleeve and a protecting sleeve that is connected to the fixing sleeve and formed along the fixing sleeve in a direction away from the terminal. The fixing sleeve is sleeved on the outer side of the terminal, and the magnetic member is sleeved on the outer side of the protecting sleeve.

Preferably, the conductive structure includes an electrode contact and a plurality of annular conductive contact pieces centered on the electrode contact. The adjacent conductive contact pieces are insulated from each other.

Preferably, the connecting portion further includes a plurality of conductive pins. The conductive structure is electrically connected to the PCB board via the conductive pins.

Preferably, when the plug is Lightning, the number of the conductive pins is at least four. The conductive structure is provided with at least four conductive contact pieces corresponding to the at least four conductive pins, and the magnetic member is used as the first "CC" electrode of the plug. The at least four conductive pins are defined as: "V+" electrode, "V−" electrode, "D+" electrode and "D−" electrode. Or, the number of the conductive pins is at least five, and the conductive structure is provided with at least five conductive contact pieces corresponding to the at least five conductive pins. The at least five conductive pins are defined as: "V+" electrode, "V−" electrode, "D+" electrode, "D−" electrode and "CC" electrode.

Preferably, when the plug is Type-C, the number of the conductive pins is at least five. The conductive structure is provided with at least five conductive contact pieces corresponding to the at least five conductive pins, and the magnetic member is used as the first "CC" electrode of the plug. The at least five conductive pins are defined as: "V+" electrode, "V−" electrode, "D+" electrode, "D−" electrode and the second "CC" electrode. Or, the number of the conductive pins is at least six, and the conductive structure is provided with at least six conductive contact pieces corresponding to the at least six conductive pins. The at least six conductive pins are defined as: "V+" electrode, "V−" electrode, "D+" electrode, "D−" electrode, the first "CC" electrode and the second "CC" electrode.

Preferably, the plurality of conductive pins are fixedly or detachably connected to the limiting member.

Preferably, the plurality of conductive pins are first integrally fixed via a plastic member, and then connected to the limiting member. Opposite ends of the plurality of integrally-fixed conductive pins are connected to the conductive structure and the PCB board, so that the conductive structure and the PCB board are electrically connected.

Preferably, the limiting member is provided with a plurality of through-holes for accommodating the plurality of conductive pins, and the number of the through-holes corresponds to that of the conductive pins. The plurality of conductive pins pass through the through-holes, and opposite ends of the conductive pins are connected to the conductive structure and the PCB board, so that the conductive structure and the PCB board are electrically connected.

Another embodiment of the present disclosure further provides an electronic device. The electronic device includes a main body and a plug. The main body is provided with a female connector. The plug includes a terminal and a connecting portion electrically connected to the terminal. The terminal is used for inserting into a socket of an electronic equipment, and the connecting portion is used for magnetically connecting with the female connector on the main body, so as to achieve charging and/or data transmission of the electronic equipment.

The plug further includes a PCB board and a first chip. The PCB board is disposed at an end of the terminal close to the connecting portion. The terminal and the first chip are both electrically connected to the PCB board. The connecting portion includes a conductive structure electrically connected to the PCB board. An accommodating space is defined between the conductive structure and the PCB board, and the first chip is disposed therein.

Preferably, the electronic device is a data cable, a docking station, a power bank, or a video connecting cable.

Compared with the prior arts, the plug and the electronic device of the present disclosure have the following beneficial effects.

The plug of an embodiment of the present disclosure includes a terminal and a connecting portion electrically connected to the terminal. The terminal is used to insert into a socket of an electronic equipment, and the connecting portion is used to magnetically connect with the peripheral female connector to achieve charging and/or data transmission of the electronic equipment. The plug further includes a PCB board and a first chip. The PCB board is disposed at one end of the terminal close to the connecting portion. The connecting portion includes a conductive structure electrically connected to the PCB board. An accommodating space is defined between the conductive structure and the PCB board to accommodate the first chip, that is, the first chip is disposed at an end of the connecting portion of the magnetic data cable. Thus, the space utilization rate of the plug can be improved, so as to achieve more charging functions of the plug; further, when the plug is Type-C, the charging function can be achieved by only one chip, which makes more components can be arranged at the connecting portion to improve the utilization rate of the components and reduces production costs. In addition, when the first chip is a fast-charging-protocol chip, the fast-charging-protocol chip is prevented to be disposed to the terminal of the plug, so as to achieve fast charging of the plug.

In the plug of an embodiment of the present disclosure, a limiting member is disposed between the conductive structure and the PCB board, and the accommodating space for accommodating the first chip is defined by the limiting member. Thus, the position of the first chip can be limited via the limiting member. In addition, the size of the accommodating space is adapted to that of the first chip, which ensures that the first chip can be entirely accommodated in the accommodating space, thereby improving the overall space utilization rate. Furthermore, the inner wall of the limiting member is made of insulating materials, which prevents a short circuit between the first chip accommodated in the accommodating space and the conductive structure, so that the limiting member can achieve the function of insulation.

The plug of an embodiment of the present disclosure further includes a second chip electrically connected to the PCB board. The first chip and the second chip are disposed on opposite sides of the PCB board. One chip is a fast-charging-protocol chip, and the other chip is a charging chip. The fast-charging-protocol chip is disposed to the connecting portion of the plug, that is, the accommodating space for accommodating the fast-charging-protocol chip is defined between the conductive structure and the PCB board, the fast-charging-protocol chip is prevented to be disposed on the terminal of the plug, which achieves a charging power of 9V, 2.2 A, 27 W compatible with Apple plug fast charging, and fast charging of Apple connector.

In the plug of an embodiment of the present disclosure, the terminal further includes a fixing member wrapping the PCB board, which can protect the components inside the plug.

In the plug of the embodiment of the present disclosure, the connecting portion includes a magnetic member surrounding the conductive structure, and an end of the conductive structure away from the PCB board protrudes from the surface of the magnetic member away from the fixing member. Thus, the female connector of the data cable is magnetically connected with the plug via the magnetic member, which facilitates users disassemble the plug and the female connector.

In the plug of the embodiment of the present disclosure, the conductive structure includes an electrode contact and a plurality of annular conductive contact pieces centered on the electrode contact, and the adjacent conductive contact pieces are insulated from each other. Thus, the female connector of the magnetic data cable is electrically connected to the plug via the conductive structure.

In the plug of the embodiment of the present disclosure, the connecting portion further includes a plurality of conductive pins, and the plurality of conductive pins are individually electrically connected to the corresponding conductive contact pieces. Since the limiting member is disposed between the conductive structure and the PCB board, that is, there is a certain distance between the conductive structure and the PCB board, the conductive structure is required to be electrically connected to the PCB board. An electrical connection between the conductive structure and the PCB can be achieved via the conductive pins, so as to achieve charging, data transmission or signal transmission of the plug.

In the plug of the embodiment of the present disclosure, the plurality of conductive pins are fixedly or detachably connected to the limiting member. If the conductive pins are fixedly connected to the limiting member, the installation and assembly of the user can be facilitated, thereby improving the installation speed. If the conductive pins are detachably connected to the limiting member, the conductive pins can have a certain range of movement, which can prevent the conductive pins from being easily worn and deformed when electrically connecting the conductive structure and the PCB board, so that a stable electrical connection is achieved.

In the plug of the embodiment of the present disclosure, the plurality of conductive pins are first integrally fixed via a plastic portion, and then assembled with the limiting member. Opposite ends of the plurality of integrally-fixed conductive pins are connected to the conductive structure and the PCB board, so as to achieve an electrical connection between the conductive structure and the PCB board, which facilitate users assemble and improve the installation speed.

In the plug of the embodiment of the present disclosure, the limiting member is provided with through-holes for accommodating a plurality of conductive pins. The number of the through-holes corresponds to the conductive pins. The plurality of conductive pins pass through the through-holes, and opposite ends of the conductive pins are electrically connected to the conductive structure and the PCB board. Thus, the conductive pins can have a certain range of movement, and the wear between the conductive pins and the limiting member can be reduced, thereby achieving charging, data transmission or signal transmission of the plug.

The electronic device of the embodiment of the present disclosure has the same beneficial effects as the above-mentioned plug, which will not be repeated here.

NUMERICAL REFERENCE IDENTIFICATION 1. plug; 2. electronic device;
11. terminal; 12. connecting portion; 21. main body; 22. plug;
111. PCB board; 112. fixing member; 113. limiting member; 121. conductive structure; 122. magnetic member; 123. conductive pin;
1111. first chip; 1112. second chip; 1121. fixing sleeve; 1122. protecting sleeve; 1131. accommodating space; 1132. through-hole; 1211. electrode contact; 1212. conductive contact piece; 1213. insulating layer.

DETAILED DESCRIPTION

In order to make the objectives, technical solutions, and advantages of the present disclosure clearer, the present disclosure is further described in detail below with reference to the accompanying drawings and embodiments. It should be understood that the specific embodiments described herein are provided for illustration only, and not for the purpose of limiting the disclosure.

Figure 1:
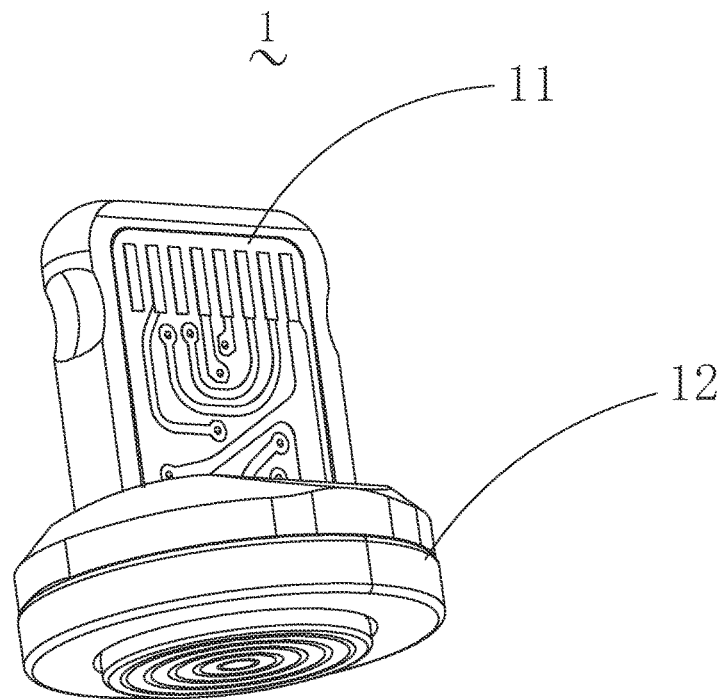
FIG. 1 is a perspective view of a plug according to a first embodiment of the present disclosure.

Referring to FIG. 1, a first embodiment of the present disclosure provides a plug 1, which includes a terminal 11 and a connecting portion 12 electrically connected to the terminal 11. The terminal 11 is used to insert into a socket of an electronic equipment, and the connecting portion 12 is used to magnetically connect with a peripheral female connector, so as to achieve charging and/or data transmission of the electronic equipment.

Figure 3:
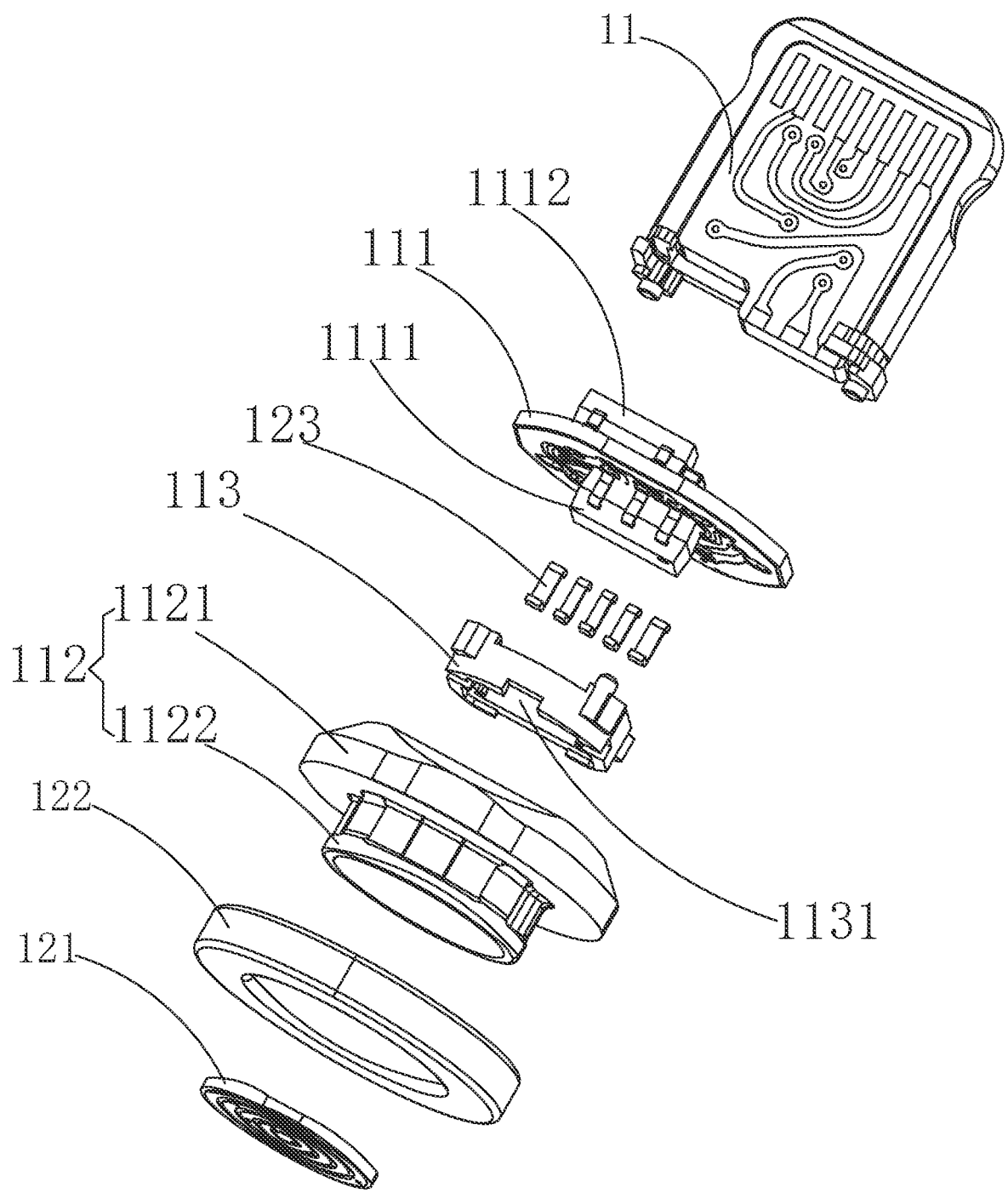
FIG. 3 is an exploded view of the plug according to the first embodiment of the present disclosure.

Further, referring to FIG. 1 and FIG. 3, the terminal 11 further includes a PCB board 111 and a first chip 1111. The PCB board 111 is disposed at an end of the terminal 11 close to the connecting portion 12, and both the terminal 11 and the first chip 1111 are electrically connected to the PCB board 111. The connecting portion 12 includes a conductive structure 121 electrically connected to the PCB board 111. An accommodating space 1131 is defined between the conductive structure 121 and the PCB board 111, and the first chip 1111 is disposed therein.

It can be understood that the first chip 1111 is disposed in the accommodating space 1131 defined by the conductive structure 121 and the PCB board 111. Thus, the first chip 1111 is prevented to be disposed to the female connector of the magnetic data cable, so that the space utilization rate can be improved to achieve more charging functions of the plug 1; further, when the plug 1 is Type-C, the charging function can be achieved by only one charging chip. The charging chip is accommodated in the accommodating space 1131, so that more components can be accommodated in the plug 1, thereby improving the utilization rate of the components and reducing the production cost.

Figure 2:
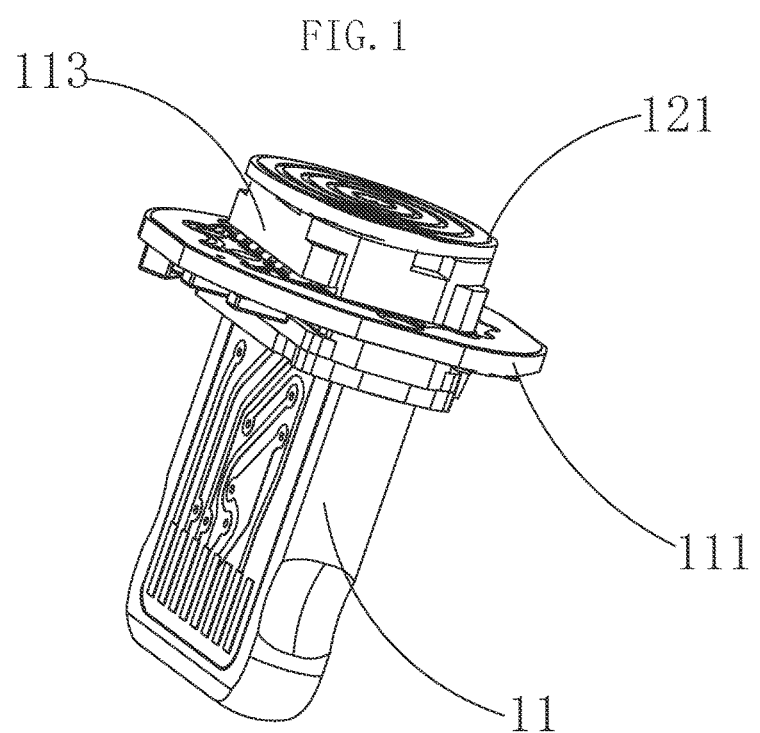
FIG. 2 is a first partial perspective view of the plug according to the first embodiment of the present disclosure.

Further, referring to FIG. 2 and FIG. 3, in an embodiment of the present disclosure, a limiting member 113 is disposed between the conductive structure 121 and the PCB board 111. The accommodating space, for accommodating the first chip 1111, is defined by the limiting member 113.

It should be noted that the inner wall of the limiting member 113 is made of insulating materials. The first chip 1111 is accommodated in the accommodating space 1131 defined by the limiting member 113, and the size of the accommodating space 1131 is adapted to that of the first chip 1111.

It can be understood that the inner wall of the limiting member 113 is made of insulating materials to prevent a short circuit between the charging chip accommodated in the accommodating space 1131 and the conductive structure 121, so as to achieve a function of insulation. In the first embodiment of the present disclosure, insulating materials can be polyvinyl chloride, synthetic resin, or the like. The size of the accommodating space 1131 is adapted to that of the first chip 1111, which ensures that the first chip 1111 can be entirely accommodated in the accommodating space 1131, thereby improving the overall space utilization rate.

In a preferred example of the first embodiment of the present disclosure, a first chip 1111 is accommodated in the accommodating space 1131. The first chip 1111 is a fast-charging-protocol chip, which can be a Type-C fast-charging-protocol chip, and the size of the accommodating space 1131 is adapted to that of the Type-C fast-charging-protocol chip. The Type-C fast-charging-protocol chip and the PCB board 111 are electrically connected to achieve fast charging of the Type-C plug.

It can be understood that other components can also be arranged on a side of the PCB board 111 opposite to the Type-C fast-charging-protocol chip, so as to improve the utilization rate of the components, thereby achieving more charging functions of the plug 1.

Further, referring to FIG. 3 again, the plug 1 of the first embodiment of the present disclosure can further include a second chip 1112 electrically connected to the PCB board 111. The first chip 1111 and the second chip 1112 are disposed on opposite sides of the PCB board 111. The type of the first chip 1111 is different from that of the second chip 1112, one chip is a fast-charging-protocol chip, and the other chip is a charging chip.

It can be understood that when the plug 1 includes the first chip 1111 and the second chip 1112, the plug 1 is a Lightning plug. When the plug 1 is a Lightning plug, two charging chips are required to achieve fast charging of the Lightning plug. That is, a common charging chip and a Lightning fast-charging-protocol chip are required to be arranged on opposite sides of the PCB board 111.

In a preferred example of the first embodiment of the present disclosure, a Lightning fast-charging-protocol chip is accommodated in the accommodating space 1131, and a common charging chip is disposed on the side of the PCB 111 opposite to the accommodating space 1131. Thus, fast charging of the Lightning plug can be achieved, and the charging power can reach 9V, 2.2 A, and 27 W.

Further, referring to FIG. 3 again, the terminal 11 of the present disclosure further includes a fixing member 112 wrapping the PCB board 111. It can be understood that the fixing member 112 is made of insulating materials. In the embodiment of the present disclosure, the fixing member 112 is a plastic sleeve.

It can be understood that the terminal 11 is fixedly connected to the connecting portion 12 via the fixing member 112, which effectively protects the PCB board 111 inside the plug 1.

Further, referring to FIG. 3 again, the fixing member 112 includes a fixing sleeve 1121 and a protecting sleeve 1122 that is connected to the fixing sleeve 1121 and formed along the fixing sleeve 1121 in a direction away from the terminal 11. The fixing sleeve 1121 is sleeved on the outer side of the terminal 11, and the magnetic member 122 is sleeved on the outer side of the protecting sleeve 1122. The fixing sleeve 1121 and the protecting sleeve 1122 can be an integral structure or a detachable structure. Specifically, in the first embodiment of the present disclosure, the fixing sleeve 1121 and the protecting sleeve 1122 are integrally formed.

Figure 4:
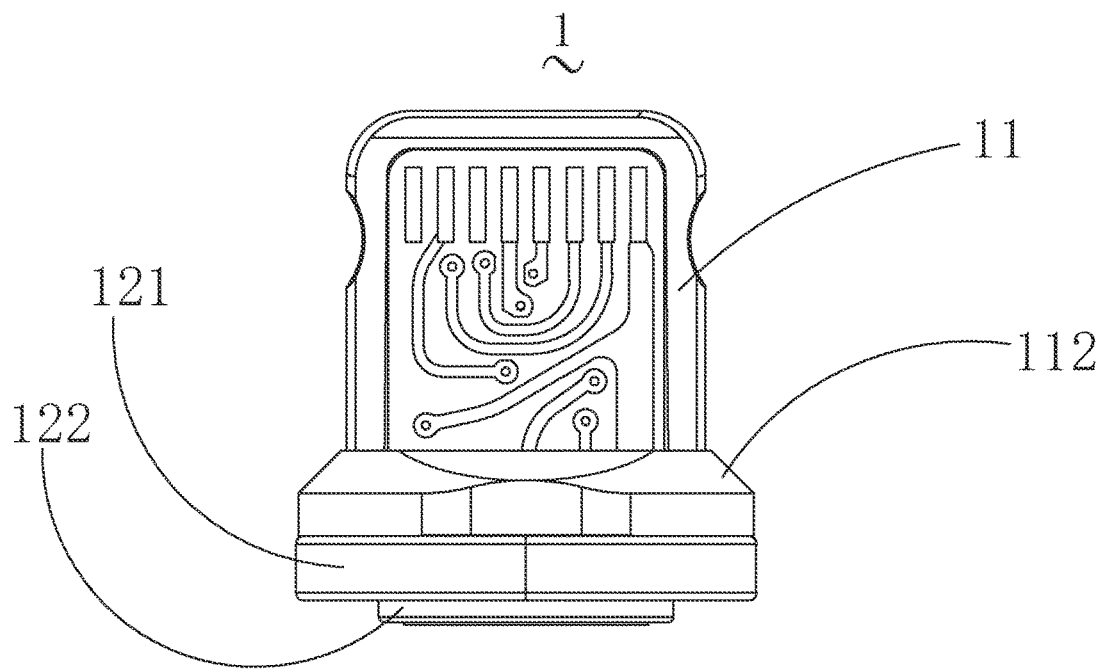
FIG. 4 is a front view of the plug according to the first embodiment of the present disclosure.

Further, referring to FIG. 3 and FIG. 4, the connecting portion 12 further includes a magnetic member 122 surrounding the conductive structure 121. An end of the conductive structure 121 away from the PCB board 111 protrudes from the surface of the magnetic member 122 away from the fixing member 112.

It can be understood that in the first embodiment of the present disclosure, the magnetic member 122 can be circle-shaped or oval-shaped. When the magnetic member 122 is oval-shaped, a 180-degree connection between the connecting portion 12 of the plug 1 and the female connector of the data cable can be achieved, which is convenient for users to use; or when the magnetic member 122 is circle-shaped, a 360-degree magnetic attraction between the connecting portion 12 of the plug 1 and the female connector of the data cable can be achieved, which is further convenient for users to use. As a preferred example in the embodiment of the present disclosure, the magnetic member 122 is circle-shaped.

Figure 5:
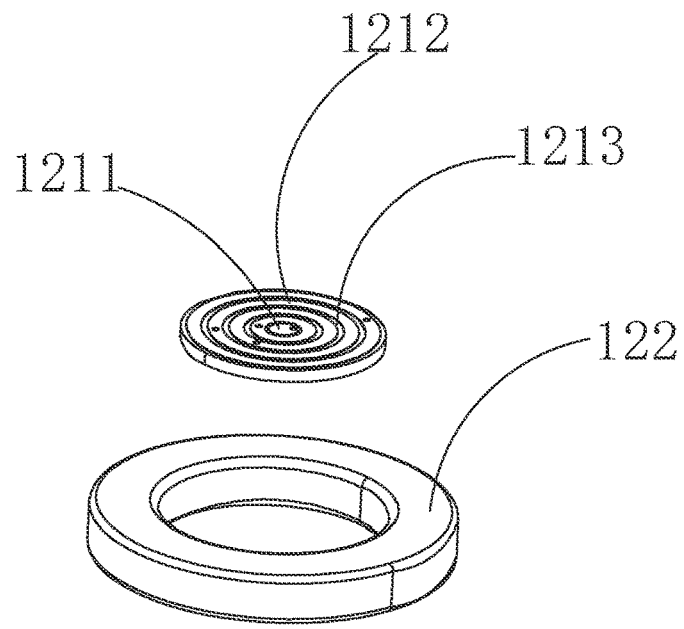
FIG. 5 is a partial perspective view of the connecting portion of the plug according to the first embodiment of the present disclosure.

Referring to FIG. 3 and FIG. 5, the conductive structure 121 includes an electrode contact 1211 and a plurality of annular conductive contact pieces 1212 centered on the electrode contact 1211, and the adjacent conductive contact pieces 1212 are insulated from each other. The number of the conductive contact pieces 1212 can be adjusted according to the requirements of actual use, which is not limited herein.

It can be understood that an insulating layer 1213 is disposed between the electrode contact 1211 and each of the conductive contact pieces 1212. The insulating layer 1213 insulates the electrode contact 1211 and each of the conductive contact pieces 1212 from each other to prevent them to be in contact with each other to cause a short circuit. It can also be understood that an insulating layer is also disposed between each of the conductive contact pieces 1212 and the magnetic member 122 to separate the conductive contact pieces 1212 and the magnetic member 122 from each other.

It should be noted that the magnetic member 122 can be a magnet with conductivity or other magnetic materials. Specifically, the magnetic member 122 can be a NdFeB (neodymium) magnet, a SmCo (samarium-cobalt) magnet, an AlNiCo (aluminum-nickel-cobalt) magnet, or an FeCrCo (iron-chromium-cobalt) magnet. In addition, the magnetic member 122 can also be used as the "CC" electrode or other electrodes of the plug. In the first embodiment of the present disclosure, the magnetic member 122 is used as the first "CC" electrode.

Further, referring to FIG. 3 again, the connecting portion 12 further includes a plurality of conductive pins 123. The conductive structure 121 is electrically connected to the PCB board 111 via the conductive pins 123.

Further, in the first embodiment of the present disclosure, the number of the conductive pins 123 is at least one. It should be noted that in some specific embodiments, the number of the conductive pins 123 is determined according to the number of the conductive contact pieces 1212.

Further, as an example of the embodiment of the present disclosure, when the number of the conductive pin 123 is one, the conductive pin 123 is used as the "V+" electrode, and the magnetic member 122 is used as the "V−" electrode. That is, the plug 1 can be used for charging and/or data transmission of an electronic equipment.

Further, when the plug 1 is Lightning, the number of the conductive pins 123 is at least four. The conductive structure 121 is provided with at least four conductive contact pieces 1212 corresponding to the at least four conductive pins 123, and the magnetic member 122 is used as the first "CC" electrode of the plug. The at least four conductive pins 123 are defined as: "V+" electrode, "V−" electrode, "D+" electrode and "D−" electrode. Or, the number of the conductive pins 123 is at least five, the conductive structure 121 is provided with at least five conductive contact pieces 1212 corresponding to the at least five conductive pins 123. The at least five conductive pins 123 are defined as: "V+" electrode, ""V−" electrode, "D+" electrode, "D−" electrode and "CC" electrode.

Optionally, as an implementation of the embodiment of the present disclosure, the number of the conductive pins 123 is four.

Specifically, the four conductive pins 123 are defined as: "V+" electrode, "V−" electrode, "D+" electrode and "D−" electrode. The number of the conductive contact pieces 1212 is four. The magnetic member 122 is also used as an electrode of signal transmission, and the magnetic member 122 is used as the first "CC" electrode. The four conductive pins 123 are correspondingly electrically connected to the four conductive contact pieces 1212. Thus, the magnetic data cable matches the existing five-core data cable, so that the magnetic data cable can achieve functions of fast charging and/or data transmission of the Lightning plug when in use.

Further, as another example of the embodiment of the present disclosure, the number of the conductive pins 123 is five.

Specifically, in the embodiment of the present disclosure, when the plug 1 is Lightning, the number of conductive pins 123 is five, which are defined as: "V+" electrode, "V−" electrode, "D+" electrode, "D−" electrode and "CC" electrode. The number of the conductive contact pieces 1212 is five, and the five conductive pins 123 are correspondingly electrically connected to the five conductive contact pieces 1212, so as to achieve functions of fast charging and/or data transmission of the Lightning plug.

Further, when the plug 1 is Type-C, the number of the conductive pins 123 is at least five, and the least five conductive contact pieces 1212 corresponding to the at least five conductive pins 123 are arranged on the conductive structure 121. The magnetic member 122 is used as the first "CC" electrode of the plug 1. The at least five conductive pins 123 are defined as: "V+" electrode, "V−" electrode, "D+" electrode, "D−" electrode and the second "CC" electrode. Or, the number of the conductive pins 123 is at least six, and the at least six conductive contact pieces 1212 corresponding to the at least six conductive pins 123 are arranged on the conductive structure 121. The at least six conductive pins 123 are defined as: "V+" electrode, "V−" electrode, "D+" electrode, "D−" electrode, the first "CC" electrode and the second "CC" electrode.

When the plug 1 is Type-C, two "CC" signals are required to achieve fast charging of the Type-C plug.

As an example of the embodiment of the present disclosure, the number of the conductive pins 123 is five.

Specifically, the five conductive pins 123 are defined as: "V+" electrode, "V−" electrode, "D+" electrode, "D−" electrode and the first "CC" electrode. The number of the conductive contact pieces 1212 is five. The magnetic member 122 is also used as an electrode for transmitting signals, and the magnetic member 122 is used as the second "CC" electrode. The five conductive pins 123 are correspondingly electrically connected to the five conductive contact pieces 1212, so as to achieve functions of fast charging and/or data transmission of the Type-C plug.

Further, as another implementation of the embodiment of the present disclosure, the number of the conductive pins 123 is six.

Specifically, the six conductive pins 123 are defined as: "V+" electrode, "V−" electrode, "D+" electrode, "D−" electrode, the first "CC" electrode and the second "CC" electrode. The number of the conductive contact pieces 1212 is six, and the six conductive pins 123 are correspondingly electrically connected to the six conductive contacts 1212, so as to achieve functions of fast charging and/or data transmission of the Type-C plug.

It can be understood that since the accommodating space 1131 for accommodating chips is defined between the conductive structure 121 and the PCB board 111, that is, there is a certain distance between the conductive structure 121 and the PCB board 111, the conductive structure 121 and the PCB board 111 is required to be electrically connected.

Further, the plurality of conductive pins 123 are fixedly or detachably connected to the limiting member 113.

It can be understood that when the conductive pins 123 are fixedly connected to the limiting member 113, the relative position therebetween remains the same after the conductive pins 123 are fixedly connected to the limiting member 113.

Figure 6:
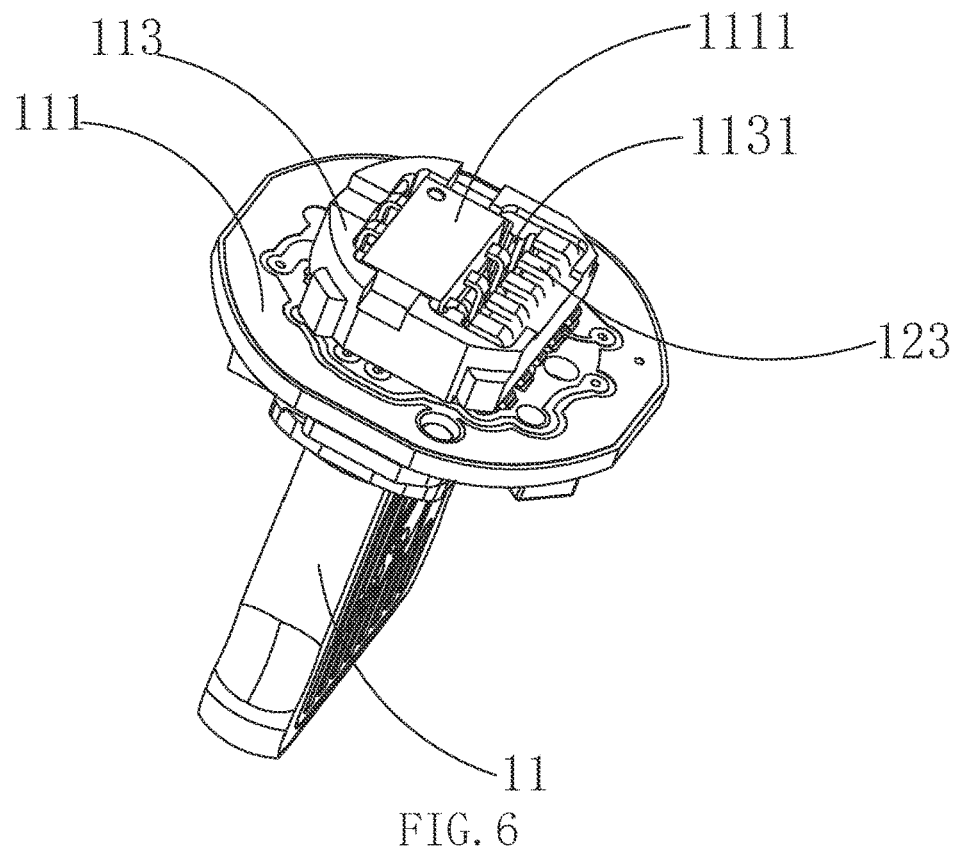
FIG. 6 is a second partial perspective view of the plug according to the first embodiment of the present disclosure.

Referring to FIG. 6, as an example of the embodiment of the present disclosure, the conductive pins 123 are fixedly connected to the limiting member 113. Opposite ends of the conductive pins 123 are bent-shaped. First, the plurality of conductive pins 123 are integrally fixed via the plastic member; then, the integrally-fixed conductive pins 123 seen as a whole are assembled with the limiting member 113; finally, opposite ends of the plurality of conductive pins 123 are welded to the PCB board 111 and the conductive structure 121 to achieve an electrical connection therebetween, so that functions of charging, data transmission, or signal transmission of the plug 1 are achieved. The conductive pins 123 and the limiting member 113 are fixedly connected, which facilitates installation and assembly, thereby increasing the installation speed.

Figure 7:
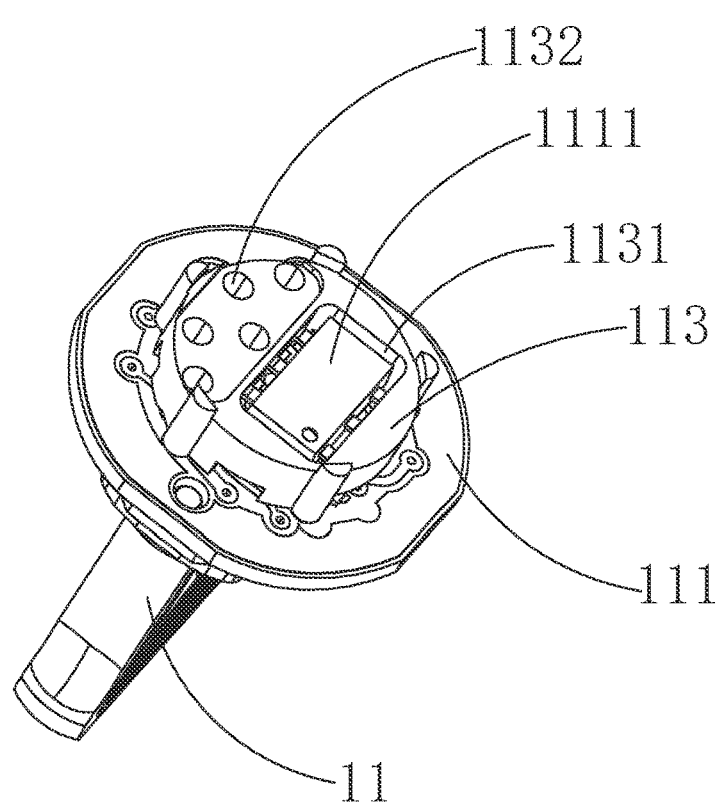
FIG. 7 is a third partial perspective view of the plug according to the first embodiment of the present disclosure.

Referring to FIG. 7, as another example of the embodiment of the present disclosure, the conductive pins 123 are detachably connected to the limiting member 113. The conductive pins 123 are elastic pogo pins. The limiting member 113 is provided with through-holes 1132 for accommodating the plurality of conductive pins. The number of the through-holes 1132 corresponds to the conductive pins 123, and the plurality of conductive pins 123 passes through the through-holes 1132. In this case, the elastic conductive pins 123 are subjected to a pressing force, and can have a certain expansion and contraction space in the through-holes 1132, so that opposite ends of the conductive pins 123 are electrically connected to the conductive structure 121 and the PCB board 111 to achieve functions of charging, data transmission or signal transmission of the plug 1. Thus, the conductive pins 123 can have a range of movement, thereby reducing the wear of the conductive pins 123.

Figure 8:
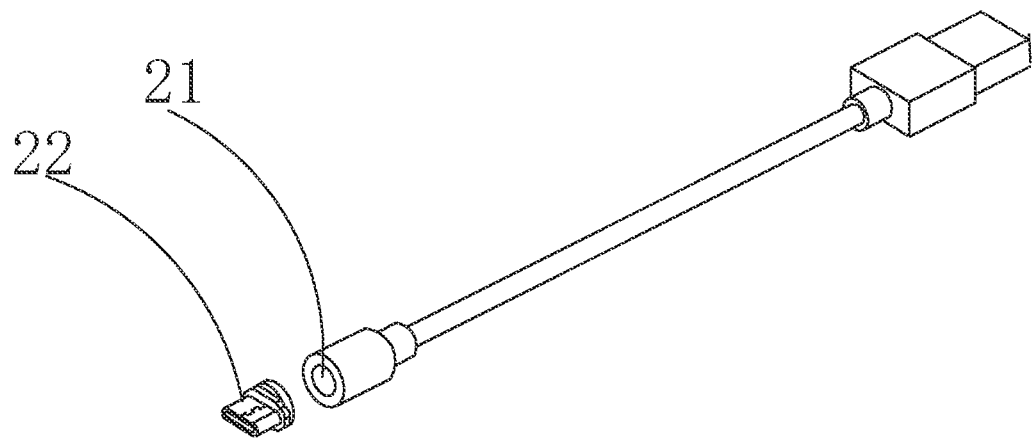
FIG. 8 is a perspective view of a plug and an electronic device according to a second embodiment of the present disclosure.

Referring to FIG. 8, a second embodiment of the present disclosure provides an electronic device 2. The electronic device 2 includes a main body 21 and a plug 22. The main body 21 is provided with a female connector, and the plug 22 includes a terminal and a connecting portion electrically connected to the terminal. The terminal is used to insert into a socket of an electronic equipment. The connecting portion is used to magnetically connect with the female connector on the main body 21 to achieve charging and/or data transmission of the electronic equipment.

The plug 22 further includes a PCB board and a first chip. The PCB board is disposed at an end of the terminal close to the connecting portion, and the terminal and the first chip are both electrically connected to the PCB board. The connecting portion includes a conductive structure electrically connected to the PCB board. An accommodating space is defined between the conductive structure and the PCB board, and the first chip is disposed therein.

It should be noted that the electronic device 2 of the second embodiment of the present disclosure can be, but is not limited to, a docking station, a mobile power source, a data cable, or a video adapter cable. In the specific embodiment of the present disclosure, the electronic device 2 is a data cable.

It can be understood that the electronic device 2 of the second embodiment of the present disclosure has the same beneficial effects as the plug 1 of the first embodiment.

The foregoing descriptions are only preferred embodiments of the present disclosure and are not intended to limit the present disclosure. Any modifications, equivalent replacements, and improvements made within the principles of the present disclosure should be included within the protection scope of the present disclosure.

The invention claimed is:

1. A plug, comprising a terminal and a connecting portion electrically connected to the terminal, wherein the terminal is used for inserting into a socket of an electronic equipment, the connecting portion being used for magnetically connecting with a peripheral female connector for charging and/or data transmission of the electronic equipment;
   the plug further comprising a first chip and a PCB board disposed at one end of the terminal close to the connecting portion, and both the terminal and the first chip being electrically connected to the PCB board; the connecting portion comprising a conductive structure electrically connected to the PCB board, with an accommodating space defined therebetween, and the first chip being disposed therein; and
   wherein a limiting member is disposed between the conductive structure and the PCB board to define the accommodating space for accommodating the first chip.

2. The plug according to claim 1, wherein the size of the accommodating space is adapted to that of the first chip.

3. The plug according to claim 1, wherein the inner wall of the limiting member is made of insulating materials.

4. The plug according to claim 1, wherein the first chip is a Type-C fast-charging-protocol chip or a Lightning fast-charging-protocol chip.

5. The plug according to claim 1, wherein the plug further comprises a second chip electrically connected to the PCB board, and the first chip and the second chip being disposed on opposite sides of the PCB board.

6. The plug according to claim 5, wherein the type of the first chip is different from that of the second chip, one chip being a fast-charging-protocol chip, and the other chip being a charging chip.

7. The plug according to claim 1, wherein the terminal further comprises a fixing member wrapping the PCB board.

8. The plug according to claim 7, wherein the connecting portion further comprises a magnetic member surrounding the conductive structure, one end of the conductive structure away from the PCB board protruding from a surface of the magnetic member away from the fixing member.

9. The plug according to claim 8, wherein the magnetic member is round-shaped or oval-shaped, so as to achieve a 360-degree magnetic attraction or a 180-degree connection between the plug and the peripheral female connector.

10. The plug according to claim 8, wherein the fixing member comprises a fixing sleeve and a protecting sleeve that is connected to the fixing sleeve and formed along the fixing sleeve in a direction away from the terminal, the fixing sleeve being sleeved on outer side of the terminal, and the magnetic member being sleeved on outer side of the protecting sleeve.

11. The plug according to claim 1, wherein the conductive structure comprises an electrode contact and a plurality of annular conductive contact pieces centered on the electrode contact, and the adjacent conductive contact pieces being insulated from each other.

12. The plug according to claim 8, wherein the connecting portion further comprises a plurality of conductive pins, and the conductive structure being electrically connected to the PCB board via the conductive pins.

13. The plug according to claim 12, wherein, when the plug is Lightning, the number of the conductive pins is at least four, the conductive structure being provided with at least four conductive contact pieces corresponding to the at least four conductive pins, and the magnetic member being used as the first "CC" electrode of the plug, the at least four conductive pins being defined as: "V+" electrode, "V−" electrode, "D+" electrode and "D−" electrode; or, the number of the conductive pins being at least five, the conductive structure being provided with at least five conductive contact pieces corresponding to the at least five conductive pins, the at least five conductive pins being defined as: "V+" electrode, "V−" electrode, "D+" electrode, "D−" electrode and "CC" electrode.

14. The plug according to claim 12, wherein, when the plug is Type-C, the number of the conductive pins is at least five, the conductive structure being provided with at least five conductive contact pieces corresponding to the at least five conductive pins, the magnetic member being used as the first "CC" electrode of the plug, and the at least five conductive pins being defined as: "V+" electrode, "V−" electrode, "D+" electrode, "D−" electrode and the second "CC" electrode; or, the number of the conductive pins being at least six, the conductive structure being provided with at least six conductive contact pieces corresponding to the at least six conductive pins, the at least six conductive pins being defined as: "V+" electrode, "V−" electrode, "D+" electrode, "D−" electrode, the first "CC" electrode and the second "CC" electrode.

15. The plug according to claim 12, wherein the plurality of conductive pins are fixedly or detachably connected to the limiting member.

16. The plug according to claim 15, wherein the plurality of conductive pins are first integrally fixed via a plastic member, and then connected to the limiting member, opposite ends of the plurality integrally-fixed conductive pins being connected to the conductive structure and the PCB board, so as to achieve an electrical connection therebetween.

17. The plug according to claim 15, wherein the limiting member is provided with through-holes for accommodating the plurality of conductive pins, the number of the through-holes corresponding to that of the conductive pins, the plurality of conductive pins passing through the through-holes, and opposite ends of the conductive pins being connected to the conductive structure and the PCB board to achieve an electrical connection therebetween.

18. An electronic device, comprising a main body and a plug, wherein the main body comprises a female connector, the plug comprising a terminal and a connecting portion electrically connected to the terminal, the terminal being used for inserting into a socket of an electronic equipment, and the connecting portion being used for magnetically connecting with the female connector of the main body for charging and/or data transmission of the electronic equipment;

the plug further comprising a PCB board and a first chip, the PCB board being disposed at one end of the terminal close to the connecting portion, the terminal and the first chip being both electrically connected to the PCB board, the connecting portion comprising a conductive structure electrically connected to the PCB board, with an accommodating space defined therebetween and the first chip being disposed therein; and wherein a limiting member is disposed between the conductive structure and the PCB board to define the accommodating space for accommodating the first chip.

19. The electronic device according to claim 18, wherein the electronic device is a data cable, a docking station, a power bank, or a video connecting cable.

* * * * *